(12) United States Patent
Mashimo

(10) Patent No.: US 6,670,831 B2
(45) Date of Patent: Dec. 30, 2003

(54) SIGNAL PROCESSING CIRCUIT AND METHOD FOR MEASURING PULSE WIDTH UNDER EXISTENCE OF CHATTERING NOISE

(75) Inventor: Akira Mashimo, Tokorozawa (JP)

(73) Assignee: Teac Corporation, Tokyo (JP)

( * ) Notice: Subject to any disclaimer, the term of this patent is extended or adjusted under 35 U.S.C. 154(b) by 0 days.

(21) Appl. No.: 10/079,805

(22) Filed: Feb. 20, 2002

(65) Prior Publication Data

US 2002/0114406 A1 Aug. 22, 2002

(30) Foreign Application Priority Data

Feb. 20, 2001 (JP) .................................. 2001-044222
Sep. 7, 2001 (JP) .................................. 2001-272571

(51) Int. Cl.[7] .................................................. H03K 5/00
(52) U.S. Cl. .......................................... 327/34; 327/551
(58) Field of Search ............................ 327/551, 34, 37, 327/199

(56) References Cited

U.S. PATENT DOCUMENTS

| | | | | |
|---|---|---|---|---|
| 4,926,072 A | * | 5/1990 | Hyodo | 327/34 |
| 5,874,839 A | * | 2/1999 | Wakimoto | 327/34 |
| 6,337,649 B1 | * | 1/2002 | Becker et al. | 327/34 |

FOREIGN PATENT DOCUMENTS

JP  36323461 A  *  9/1988

* cited by examiner

*Primary Examiner*—Dinh T Le
(74) *Attorney, Agent, or Firm*—Anderson Kill + Olick P.C.; Eugene Lieberstein; Michael N. Meller

(57) ABSTRACT

A signal processing circuit and method for measuring the width of an input pulse signal that contains chattering noise. The signal processing circuit converts the input pulse signal into an output pulse signal having no chattering noise by setting and resetting a flip-flop circuit at a timing that is delayed by a predetermined time after the rise and fall in the input pulse signal.

9 Claims, 12 Drawing Sheets

SIGNAL PROCESSING CIRCUIT AND METHOD FOR MEASURING PULSE WIDTH UNDER EXISTENCE OF CHATTERING NOISE

BACKGROUND OF THE INVENTION

1. Field of the Invention

The present invention generally relates to a signal processing circuit and a signal processing method, and more particularly, to a signal processing circuit and a signal processing method that convert a frequency modulation signal into digital data.

2. Description of the Related Art

FIG. 6 is a block diagram showing the structure of an optical disk drive.

The optical disk drive 100 shown in FIG. 6 is a CD-R drive, for example, on which a CD-R disk 40 is set. Information is recorded in, and read out of, the CD-R disk 40.

The optical disk drive 100 is configured by an optical system 41, a spindle motor 42, a sled motor 43, a laser driver 44, a front monitor 45, an auto laser power control (ALPC) circuit 46, a recording compensation circuit 47, a wobble signal processing unit 48, an RF amplifier 49, a focus/tracking servo circuit 50, a radial servo circuit 51, a spindle servo circuit 52, a CD encoding/decoding circuit 53, a D/A converter 54, an audio amplifier 55, RAMs 56 and 58, a CD-ROM encoding/decoding circuit 57, an interface/buffer controller 59, and a CPU 60. The optical disk drive 100 performs recording and reading out of data in response to a command sent by a host computer 61.

The spindle motor 42 controlled by the spindle servo circuit 52 rotates the optical disk 40 at a predetermined rotational speed. The optical system 41 is facing the optical disk 40. The optical system 41 records data by emitting a laser beam to the optical disk 40, or reads out the data by detecting a reflectional laser beam from the optical disk 40. The sled motor 43 and the focus/tracking servo circuit 50 control the position of the laser beam emitted to the optical disk 40.

The sled motor 43, which is controlled by the radial servo circuit 51, actuates a carriage, part of the optical system 41, in the radial direction. The focus/tracking servo circuit 50 controls a focus actuator and a tracking actuator (both not shown) of the optical system 41.

The read signal outputted from the optical system 41 is provided to the RF amplifier 49. The RF amplifier 49 amplifies the read signal. The read signal, after being separated into servo signals of different kinds, is provided to the CD encoding/decoding circuit 53 as a main signal. The servo signals are provided to each servo circuit.

The CD-ROM encoding/decoding circuit 57 performs operations such as encoding and decoding of the error correction coding (ECC) that is unique to the CD-ROM, and detecting a header. The RAM 56 provides the CD-ROM encoding/decoding circuit 57 with a working memory area. The interface/buffer controller 59 exchanges data with the host computer 61 and controls a data buffer. The RAM 58 provides the interface/buffer controller 59 with a working memory area.

In the case that the optical disk 40 is an audio disk, the read signal decoded by the CD encoding/decoding circuit 53 is transferred to the D/A converter 54 for the conversion into an analog signal, and amplified by the audio amplifier 55.

The CPU 60 controls the entire operation of the optical disk drive.

FIG. 7 is a schematic sectional view showing the structure of an optical disk.

As shown in FIG. 7, a wobble 40b is formed along each track 40a on the CD-R disk 40 in advance. A wobble signal is obtained by detecting the wobble 40b. The wobble signal, which is modulated in FM, contains control information of different kinds, such as an address indicating a position in the optical disk 40. The control information is obtained by demodulating the FM signal obtained by detecting the wobble 40b. In order to obtain correct information such as an address, it is necessary to convert the wobble signal modulated in FM into digital data.

FIG. 8 is a block diagram showing a conventional signal processing circuit as an example. FIGS. 9 (A)–(D) are waveforms of the conventional signal processing circuit.

The signal processing circuit 500 shown in FIG. 8 is configured by a rise/fall edge detecting circuit 501, a counter circuit 502, a latch circuit 503, and a digital low pass filter (LPF) 504.

The rise/fall edge detecting circuit 501 is provided with an FM signal shown in FIG. 9 (A) inputted through an FM signal terminal 505. The rise/fall edge detecting circuit 501 compares the FM signal with the zero level, and generates an FM pulse signal shown in FIG. 9 (B) that is at a high level if the FM signal is higher than the zero level, and at a low level if the FM signal is lower than the zero level. The rise/fall edge detecting circuit 501 further generates a rise/fall edge signal shown in FIG. 9 (C) by detecting rise edges and fall edges of the FM pulse signal. The rise/fall edge signal is provided to the counter circuit 502, the latch circuit 503, and the digital LPF 504.

The counter circuit 502 is cleared in response to reception of the rise/fall edge signal sent from the rise/fall edge detecting circuit 501, and counts the clock signals provided through a clock signal terminal 506. The count of the counter circuit 502 changes as shown in FIG. 9 (D), and is provided to the latch circuit 503.

The latch circuit 503 is provided with the count of the counter circuit 502 and the rise/fall edge signal of the rise/fall edge detecting circuit 501, and latches counts Q1-Qn in response to the rise/fall edge signal. The counts latched as Q1-Qn are sent to the digital LPF 504.

The digital LPF 504 is provided with the counts of the latch circuit 503 and the rise/fall edge signal of the rise/fall edge detecting circuit 501. The digital LPF 504 eliminates noise in the FM signal as a digital low pass filter based on the counts provided by the latch circuit 503. A digital FM signal, after being processed by the digital LPF 504, is outputted from digital FM signal terminal 507. The digital FM signal is demodulated and the control information contained in the digital FM signal is extracted.

However, the actual FM signal contains significant noise.

With reference to FIGS. 10, 11 (A)–(D), and 12 (A)–(C), the operation of the conventional signal processing circuit is further described.

As shown in FIG. 10, the actual FM signal crosses across the zero level several times as it passes through the zero level region due to the noise. If the actual FM signal is converted into an FM pulse signal without any countermeasure for noise reduction, undesirable pulses, or chattering noise, is generated before and after the true FM pulse signal, as shown in FIG. 11 (A). Because of the generation of these undesirable pulses (chattering noise), a plurality of undesirable rise/fall edges are generated as shown in FIG. 11 (B). The counter circuit 502 counts, in response to these undesirable rise/fall edges, the clock signal. It is impossible to obtain an accurate FM pulse signal in this situation.

[Conventional Technique]

A method for detecting the rise/fall edges of the FM pulse signal, by excluding time periods in which chattering noise is generated, has been proposed. The method will be described with reference to FIG. 12 below.

FIG. 12 is waveforms showing a conventional method for eliminating the noise. FIG. 12 (A) is a waveform of an inputted FM pulse signal; FIG. 12 (B) is a waveform of the FM pulse signal after noise-reduction; and FIG. 12 (C) is a waveform of the rise/fall edge signal of the pulse signal after noise reduction.

In a conventional technique, an edge is identified subject to the level of an FM pulse signal remaining at the same level for a predetermined time period T3. The FM pulse signal rises to a high level at time t1, but it falls to a low level within the predetermined time period T3. It is assumed in this conventional technique that the rise edge of the FM pulse signal at time t1 is generated by noise, and accordingly this rise edge is ignored. However, the FM pulse signal rises to a high level at time t2, and it remains at the high level for more than the predetermined time period T3 after the time t2. The rise edge of the FM pulse signal at time t2 is considered to be a true edge that is not caused by noise. The rise edge of the FM pulse signal at time t7 is also identified as a true edge of the FM pulse signal.

Likewise, the FM pulse signal falls at time t4 but it rises before the predetermined time period T3 passes. Accordingly, the fall edge is ignored. The fall edges at time t5 and t9 are identified as true edges because they remain at a low level for more than the predetermined time T3.

The rise/fall edge signal after eliminating the noise contained in the FM pulse signal, as shown in FIG. 12 (C), is obtained by the conventional technique.

As described above, the FM pulse signal contains noise that results in rise and fall in the FM pulse signal. If the edges caused by the noise are detected, and the clock signal is counted even during the interval between the edges, a count based on the noise is outputted. Accordingly, the digital FM signal cannot be reproduced due to the effect of the noise.

The conventional technique to eliminate the noise is a method in which an edge is ignored unless the FM pulse signal remains at the same level for a predetermined time period T3 after the edge appears. The conventional technique, however, causes a delay in detecting edges. If the FM pulse signal is noisy as shown in FIG. 12 (A), the first rise edge in the FM pulse signal after conventional noise reduction shown in FIG. 12 (B) is detected at time t3. The noise causes a delay of time Tx. Similarly, the first fall edge in the FM pulse signal after conventional noise reduction is detected at time t6 after a delay of Ty. Both Tx and Ty are longer than T3. The second rise edge in the FM pulse signal after conventional noise reduction, however, is detected at time t8. Because noise does not affect the detection of this rise edge, the delay in detecting the rise edge at time t8 is T3, that is, the predetermined time period. Likewise, the second fall edge in the FM pulse signal after conventional noise reduction is detected at time t10 after the delay of T3. The amount of noise affects the delay Tx and Ty, and causes fluctuation in the rise/fall edge signal.

SUMMARY OF THE INVENTION

Accordingly, it is a general object of the present invention to provide a novel and useful signal processing circuit and a signal processing method in which the problem described above is eliminated.

Another and more specific object of the present invention is to provide a signal processing circuit and a signal processing method for accurately detecting a time period in which an input pulse signal remains at a high level and/or at a low level by eliminating noise contained in the input pulse signal.

To achieve one of the objects, a signal processing circuit for converting an input signal containing chattering noise therein into an output signal, according to the present invention, includes: a first accumulative timer that starts, in response to a change in the input signal from a first input level to a second input level, measuring a first time period in which the input signal is at the second input level; sends a first signal when the first time period reaches a first predetermined time, and is reset in response to a first change in the output signal from a first output level to a second output level, and a signal generator that turns, in response to the first signal sent by the first accumulative timer, the output signal to the second output level.

The signal processing circuit according to the present invention measures, by using the accumulative timer, a time period in which the input signal is at a high (low) level until the first predetermined time passes, and turns the output signal to a high (low) level by activating the signal generator. The accumulative timer is reset at the same time.

The accumulative timer accumulates only the time period in which the input signal is at a high (low) level, but disregards the time period in which the input signal is at a low (high) level. Consequently, the pulse signal that is outputted by the signal generator has a pulse width that is equal to the total width of high (low) level pulses including the high (low) level pulses caused by the chattering noise. In other words, the pulse signal that is outputted by the signal generator is an imaginary pulse that is formed by gathering all high (low) level pulses.

The pulse width of the imaginary pulse described above is substantially equal to the pulse width of the true FM pulse signal having no chattering noise therein.

The chattering of the pulse signal that is outputted by the signal generator can be avoided by delaying the rise (fall) of the pulse signal by the first predetermined time period until the chattering noise of the input signal stops. The first predetermined time period is determined in consideration of the noise level contained in the input signal.

To handle both high and low levels, the signal processing circuit according to the present invention further includes a second accumulative timer that starts, in response to a change in the input signal from the second input level to the first input level, measuring a second time period in which the input signal is at the first input level, sends a second signal when the second time period reaches a second predetermined time, and is reset in response to a second change in the output signal from the second output level to the first output level, wherein the signal generator turns, in response to the second signal sent by the second accumulative timer, the output signal to the first output level, and the first predetermined time and the second predetermined time are determined in connection with a duty ratio of the first input level and the second input level.

Because the first predetermined time and the second predetermined time can be determined independently, the duty ratio of the pulse signal outputted by the signal generator can be set in accordance with the properties of the input signal.

The present invention can be represented as a signal processing method for converting an input signal having chattering noise therein into an output signal, including a step of starting a first accumulative timer in response to a change in the input signal from a first input level to a second input level, a step of measuring a first time period in which the input signal is at the second input level, a step of informing a signal generator whether a first predetermined time has passed, a step of turning the output signal to the second output level in response to information that the first predetermined time has passed, and a step of resetting the timer in response to a change in the output signal from the first output level to the second output level.

Other objects and further features of the present invention will be apparent from the following detailed description when read in conjunction with the accompanying drawings.

DETAILED DESCRIPTION OF THE PREFERRED EMBODIMENTS

A description of preferred embodiments is now given in connection to the drawings.

Figure 1:
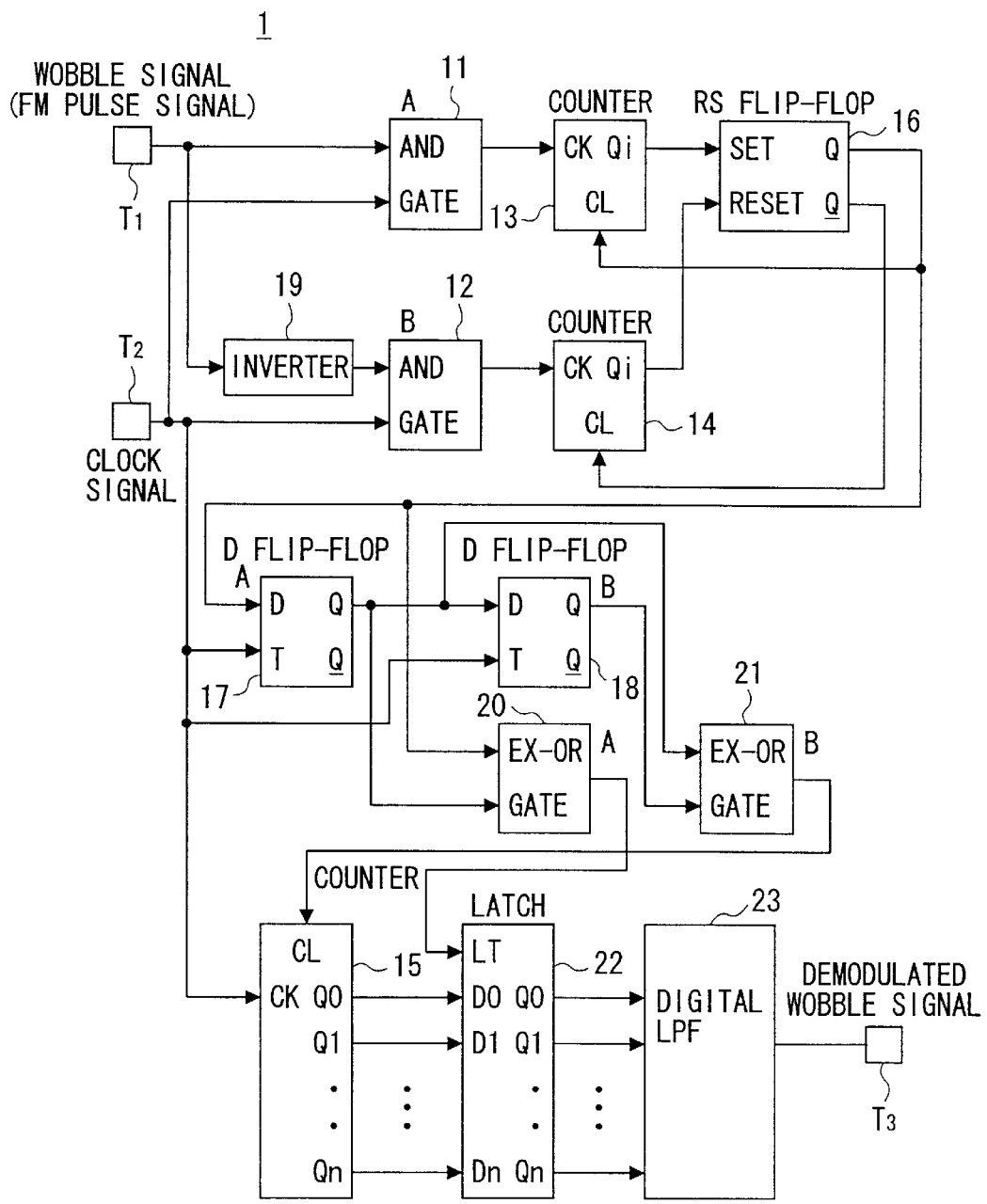
FIG. 1 is a block diagram showing a signal processing circuit in connection with the embodiment of the present invention.

FIG. 1 is a block diagram showing a signal processing circuit in connection with an embodiment of the present invention.

Figure 6:
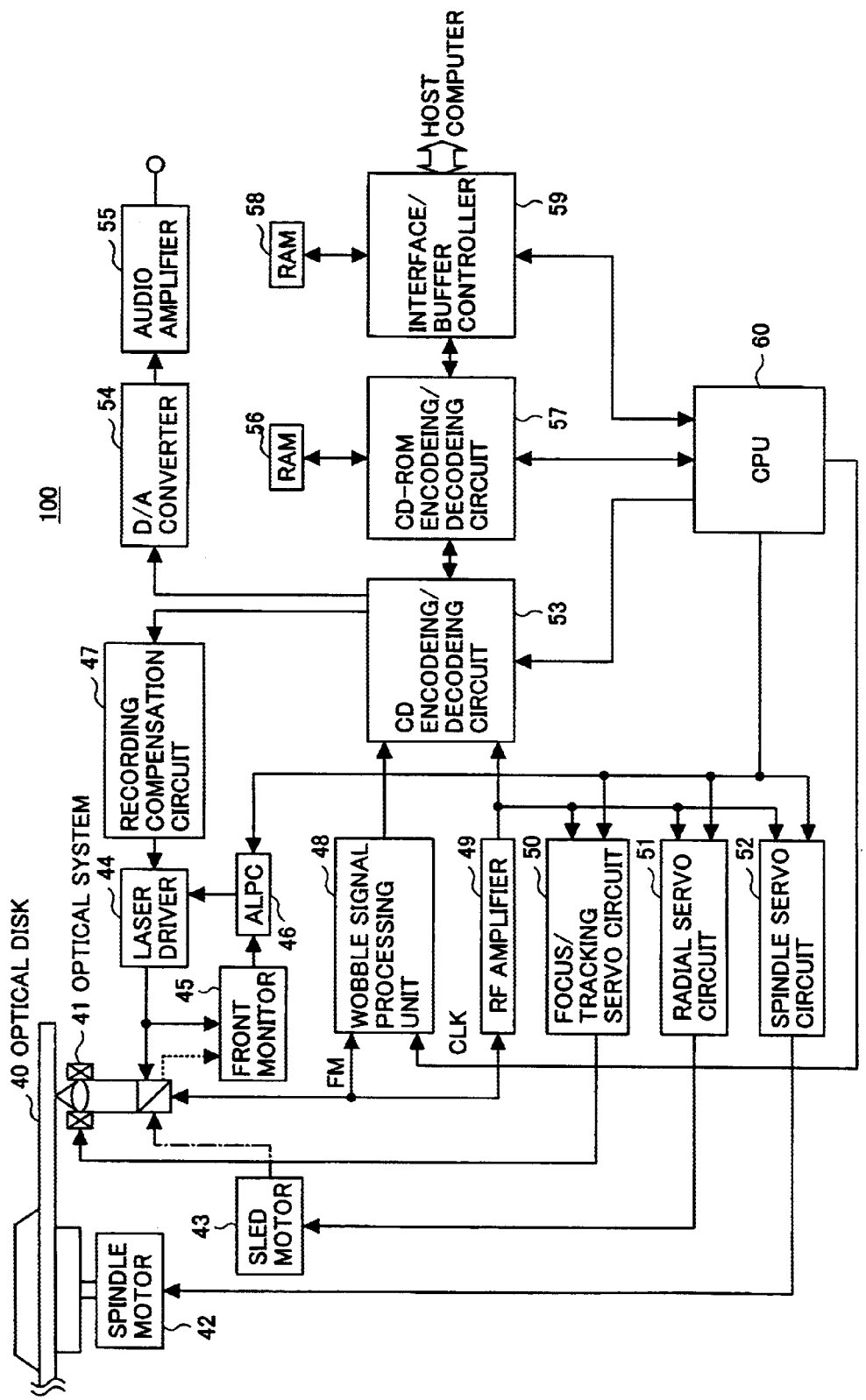
FIG. 6 is a block diagram showing the total configuration of an optical disk drive.
Figure 7:
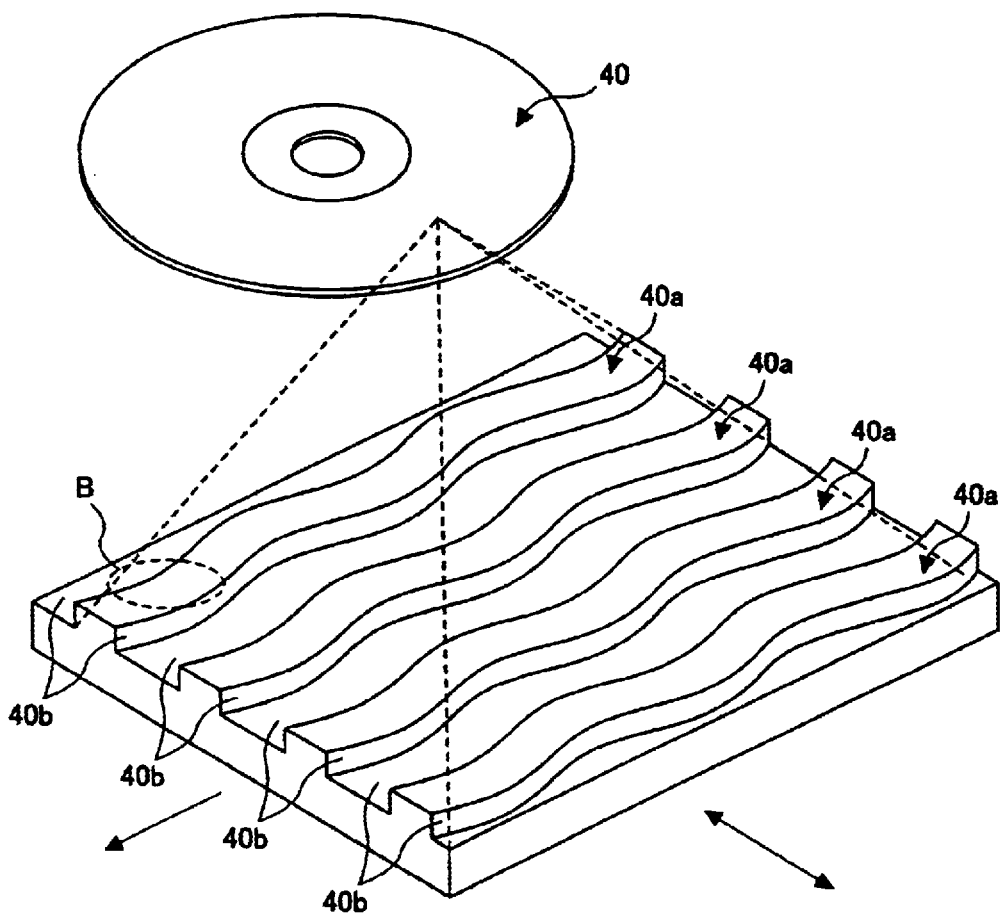
FIG. 7 is a schematic drawing showing the structure of the tracks and wobbles of an optical disk.
Figure 8:
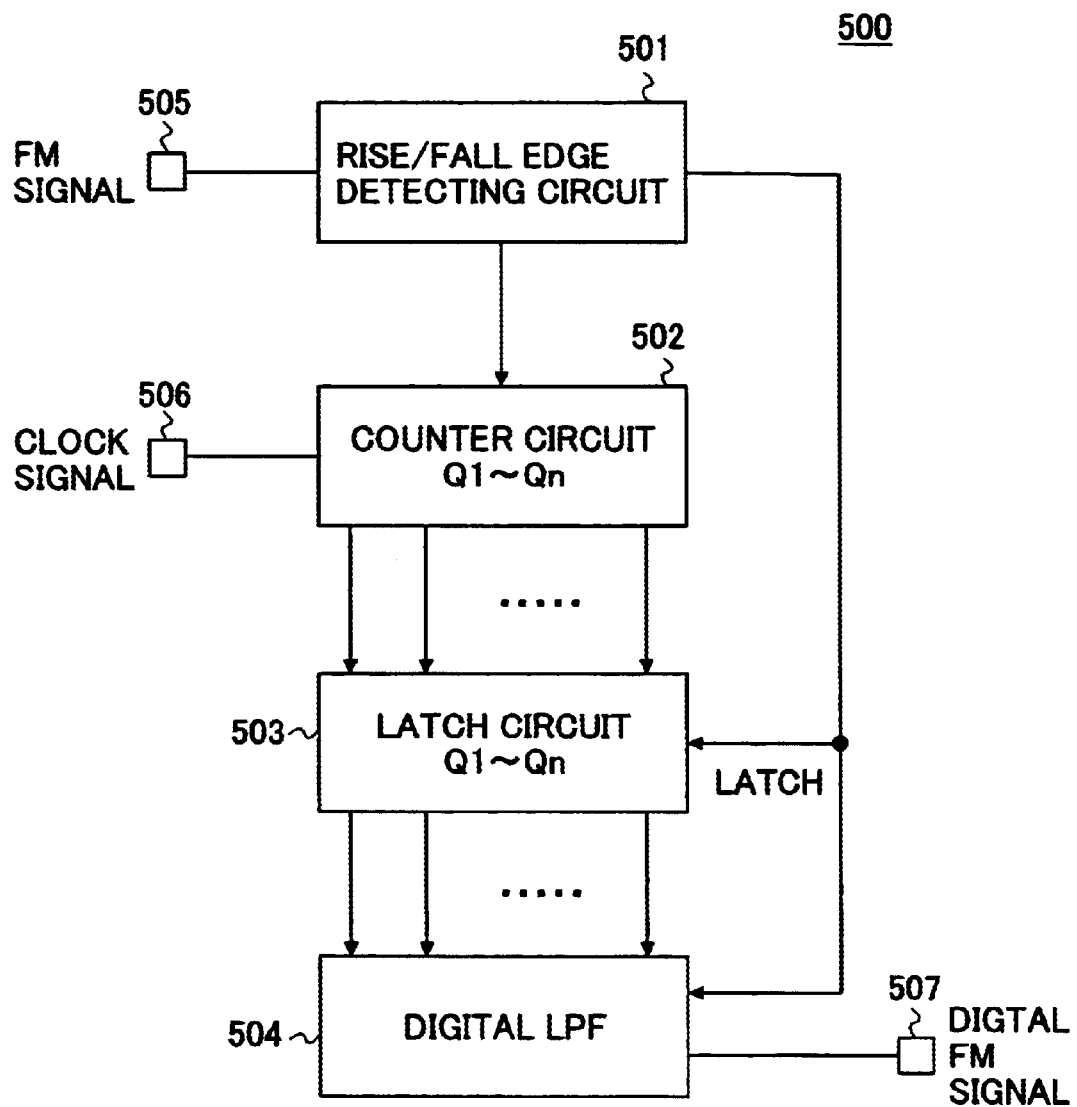
FIG. 8 is a block diagram showing the wobble signal processing unit, as an example of the related art, of the optical disk drive shown in FIG. 6.
Figure 9:
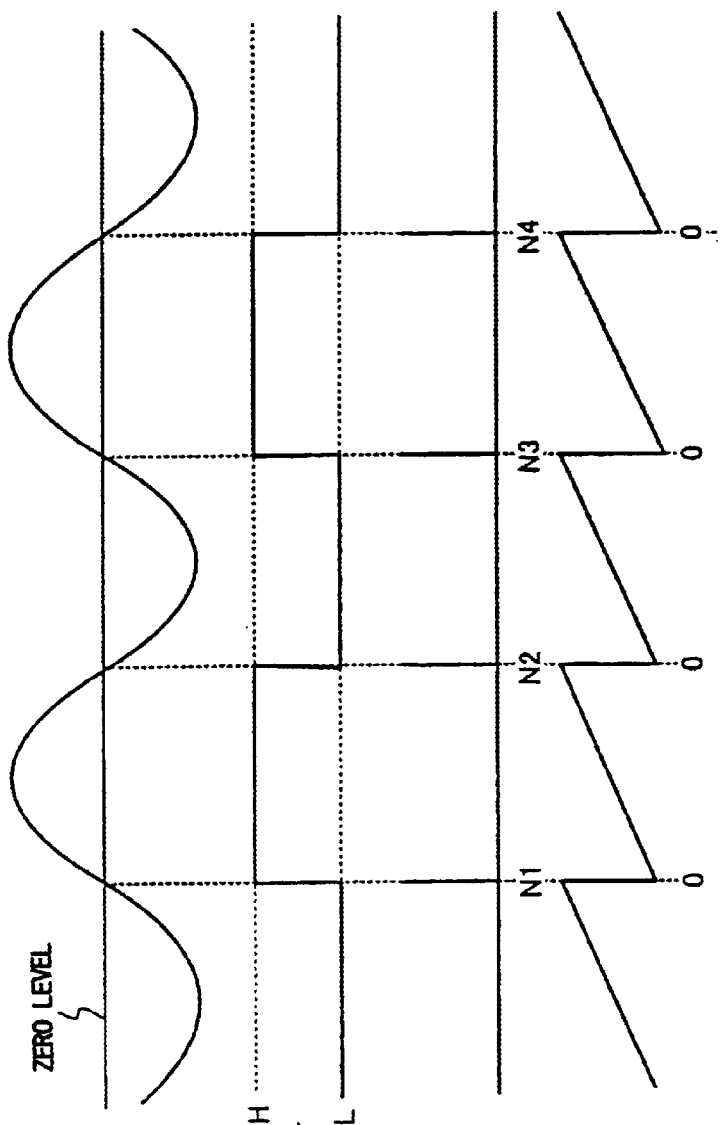
FIG. 9 is a schematic drawing showing waveforms of the wobble signal processing unit shown in FIG. 8.
Figure 10:
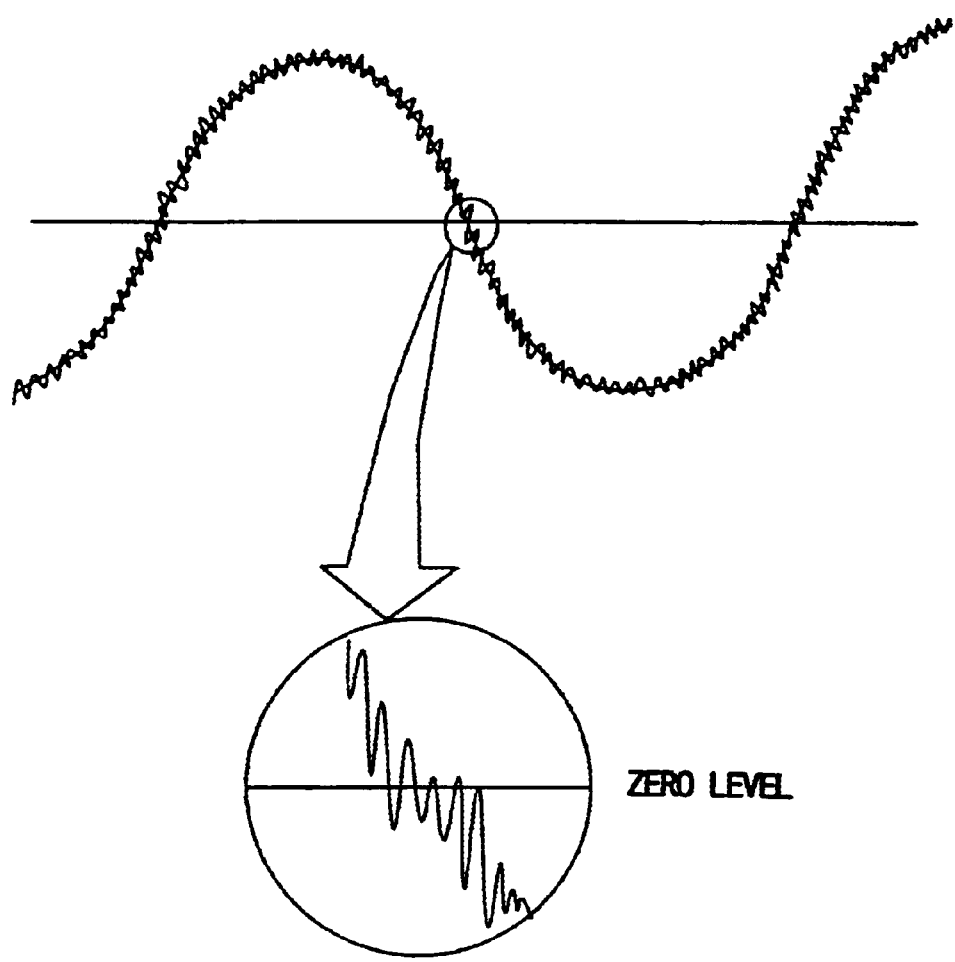
FIG. 10 is a schematic drawing showing a waveform of an actual FM signal having noise.
Figure 11:
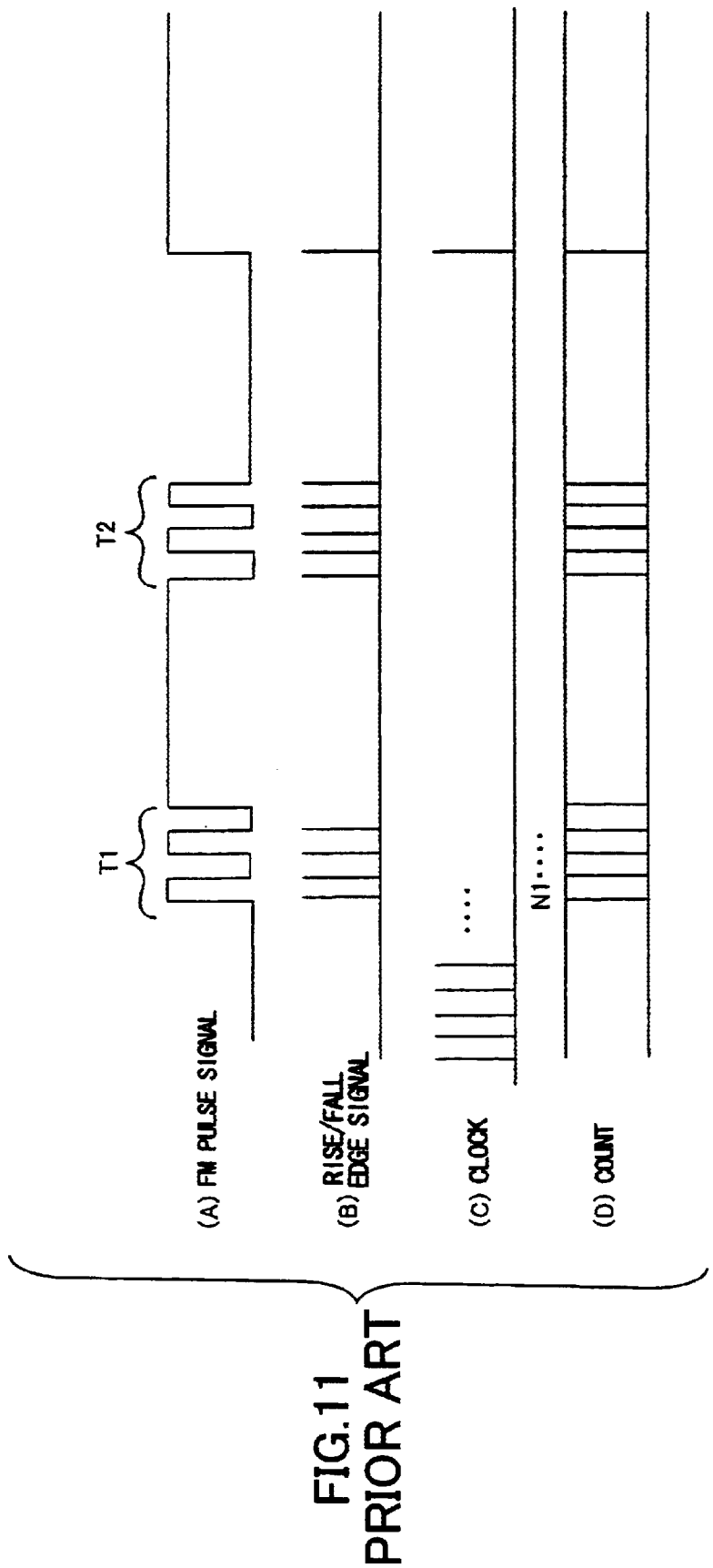
FIG. 11 is a schematic drawing showing waveforms of the wobble signal processing unit in the case where the actual FM signal having noise is inputted.
Figure 12:
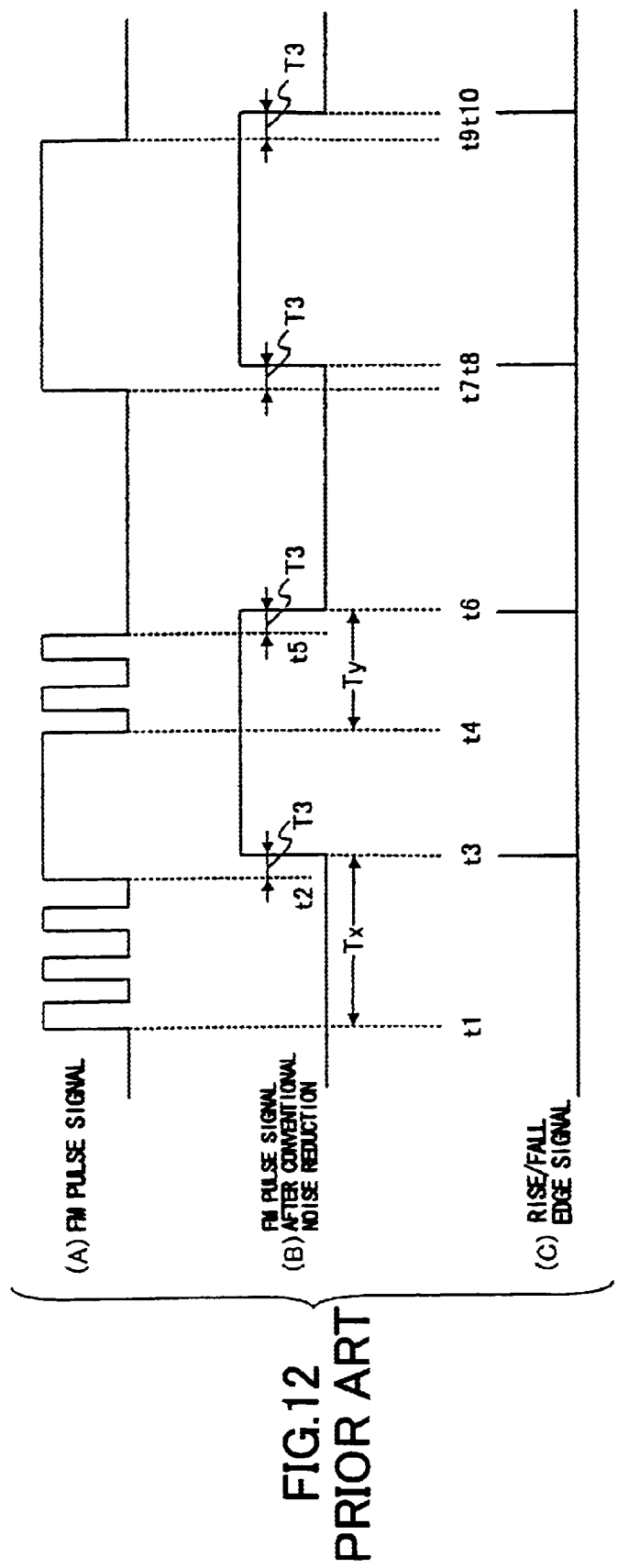
FIG. 12 is a schematic drawing showing waveforms of the wobble signal processing unit to which a conventional anti-chattering technique is applied.

A signal processing circuit 1 is provided in the wobble signal processing unit 48 shown in FIG. 6. The signal processing circuit 1 is configured by AND gates 11 and 12, counters 13, 14, and 15, an RS flip-flop 16, D flip-flops 17 and 18, an inverter circuit 19, EX-OR gates 20 and 21, a latch circuit 22, and a digital low pass filter (LPF) 23.

The operation of the signal processing circuit 1 will be described in reference to FIG. 2.

Figure 2:
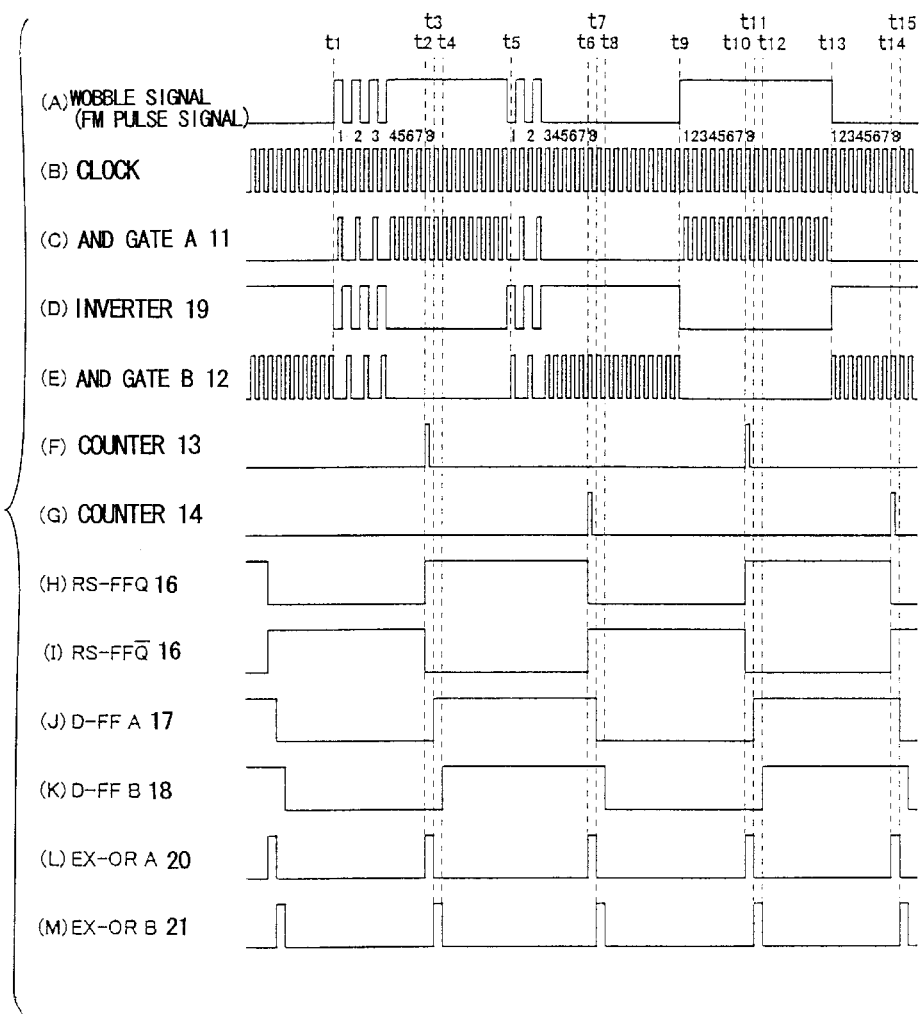
FIG. 2 is a schematic drawing showing waveforms of the signal processing circuit shown in FIG. 1.

FIG. 2 shows the waveform of the signal processing circuit 1. FIG. 2(A) is a wobble signal; FIG. 2(B) is a clock signal; FIG. 2(C) is the output of the AND gate 11; FIG. 2(D) is the output of the inverter circuit 19; FIG. 2(E) is the output of the AND gate 12; FIG. 2(F) is the output of the counter 13; FIG. 2(G) is the output of the counter 14; FIG. 2(H) is the non-inverted output of the RS flip-flop 16; FIG. 2(I) is the inverted output of the RS flip-flop 16; FIG. 2(J) is the output of the D flip-flop 17; FIG. 2(K) is the output of the D flip-flop 18; FIG. 2(L) is the output of the EX-OR gate 20; and FIG. 2(M) is the output of the EX-OR gate 21.

The wobble signal shown in FIG. 2(A) is the FM pulse signal. The wobble signal is provided to the AND gate 11 and the inverter 19 through a terminal $T_1$. The clock signal shown in FIG. 2(B) is provided to the AND gate 11 and the AND gate 12 through a terminal $T_2$.

As shown in FIG. 2(C), when the wobble signal inputted at the terminal $T_1$ is at a high level, the clock signal inputted at the terminal $T_2$ passes through the AND gate 11, and is provided to the clock input terminal of the counter 13. The counter 13 counts the clock signal outputted from the AND gate 11, and provides the i-th digit $Q_i$ of the clock count to the set terminal of the RS flip-flop 16. FIG. 2 corresponds to the case that "i" is "3".

As shown in FIG. 2(D), the wobble signal inputted through the terminal $T_1$ is inverted by the inverter circuit 19, and provided to the AND gate 12. When the inverted wobble signal outputted from the inverter circuit 19 is at a high level, the clock signal inputted at the terminal $T_2$ passes through the AND gate 12, as shown in FIG. 2(E), and is provided to the clock input terminal of the counter 14.

The counter 14 counts the clock signal that has passed through the AND gate 12 and provides the i-th digit $Q_i$ of the clock count to the reset terminal of the RS flip-flop 16. As shown in FIG. 2(H) and (I), when the i-th digit Qi of the clock count of the counter 13 is turned on, the non-inverted output Q is set, that is, set at a high level. When the i-th digit Qi of the clock count of the counter 14 is turned on, the non-inverted output Q is reset, that is, set at a low level.

The non-inverted output Q of the RS flip-flop is provided to the D flip-flop 17 and the EX-OR gate 20 as well as the "clear" terminal CL of the counter 13. The inverted output /Q of the RS flip-flop 16 is provided to the "clear" terminal of the counter 14.

The counter 13 is set at a "clear" state when the non-inverted output Q of the RS flip-flop 16 is at a high level. The counter 14 is set at a "clear" state when the inverted output /Q of the RS flip-flop 16 is at a high level.

The "data" terminal D of the flip-flop 17 is provided with the non-inverted output Q of the RS flip-flop 16, and the clock terminal of the D flip-flop 17 is provided with the clock signal inputted through the terminal T2. The D flip-flop 17 holds a level inputted to the data terminal when the clock signal rises, and outputs the level. The output Q of the D flip-flop 17 is provided to a "data" terminal of the D flip-flop 18 and to the EX-OR gate 20. The EX-OR gate 20 outputs an EX-OR value between the non-inverted output Q of the RS flip-flop 16 and the non-inverted output Q of the D flip-flop 17. The output of the EX-OR gate 20 is provided to the latch circuit 22. The latch circuit 22 latches the output of the counter 15 in response to the output of the EX-OR gate 20.

The D flip-flop 18 is provided with the output Q of the D flip-flop 17 at a "data" terminal and the clock signal inputted through the terminal T2 at a "clock" terminal. The D flip-flop 18 holds a level inputted to the "data" terminal when the clock rises, and outputs the level. The output Q of the D flip-flop 18 is provided to the EX-OR gate 21. The EX-OR gate 21 outputs an EX-OR value between the output of the D flip-flop 17 and the output of the D flip-flop 18. The output of the EX-OR gate 21 is provided to a "clear" terminal of the counter 15. The counter 15 clears its count in response to the output of the EX-OR gate 21. The counter 15 counts the clock inputted through the terminal T2, and provides the count of the clock to the latch circuit 22. The latch circuit 22 latches the count provided by the counter 15 when the output of the EX-OR gate 20 rises.

The control information such as address information indicated as a bi-phase signal is obtained by filtering the output of the latch circuit 22 by the digital LPF 23.

FIG. 2 shows that the counter 14 is set at "clear" state at time t1 and t9 since the inverted output /Q of the RS flip-flop 16 is at a high level. The counter 13 counts the clock outputted from the AND gate 11 since the non-inverted output Q of the RS flip-flop 16 is at a low level.

Because it is assumed that the output Qi of the counter 13 is the third digit Q3 in this example, the output Qi turns to a high level from a low level at every 8 clocks outputted from the AND gate 11, that is, at time t2 and t10.

When the output Qi of the counter 13 turns to a high level at time t2 and t10, the non-inverted output Q and the inverted output /Q of the RS flip-flop 16 turn to a high level and to a low level, respectively. When the inverted output Q of the RS flip-flop 16 turns to a low level, the counter 14 is disengaged from the "clear" state and starts counting the clock outputted from the AND gate 12. The counter 13 is set at a "clear" state since the non-inverted output Q of the RS flip-flop 16 turns to a high level.

Further, although the output of the RS flip-flop 16 turns to a high level at time t2 and t10, the output of the D flip-flop 17 remains at a low level. The high level of the RS flip-flop 16 and the low level of the D flip-flop 17 are inputted to the EX-OR gate 20, resulting in reversing of the output of the EX-OR gate 20 from a low level to a high level. Since the output of the EX-OR gate 20 turns from a low level to a high level, the latch circuit 22 latches the output from the counter 15 in response to a rise edge in the output of the EX-OR gate 20.

When the output of the D flip-flop 17 turns to a high level at times t3 and t11, an input to the EX-OR gate 21 turns to a high level. On the other hand, the output of the D flip-flop 18 remains at a low level until the next clock is provided, the other input of the EX-OR gate 21 is at low level. The output of the EX-OR gate 21, therefore, is reversed from a low level to a high level. The count of the counter 15 is cleared in response to the rise of the output from the EX-OR gate 21. As described above, the count of the counter 15 is latched by the latch circuit 22 first, and then cleared.

When the clock rises at times t4 and t12, the D flip-flop 18 turns its non-inverted output Q to a high level. Because both of the two inputs of the EX-OR gate 21 become a high level, the output of the EX-OR gate 21 returns to a low level. The counter 15 is cleared.

When the wobble signal turns to a low level at time t5 and t13, the counter 14 start counting the clock outputted from the AND gate 12 since the non-inverted output /Q of the RS flip-flop 16 is at low level. When the third digit Q3 of the count of the counter 14 turns to a low state at time t6 and t14, the output of the RS flip-flop 16 is reset. The output of the EX-OR gate 20 turns from a low level to a high level, and the latch circuit 22 latches the count of the counter 15.

When the clock inputted to the D flip-flop 17 at times t7 and t15 rises, the D flip-flop latches the output Q of the RS flip-flop, and consequently turns to a low level. Since the output of the D flip-flop turns to a low level, the output of the EX-OR gate 20 turns to a low level. Since the output of the D flip-flop 17 becomes low, the output of the EX-OR gate 21 turns to a low level, followed by clearing the counter 15. When the clock provided to the D flip-flop 18 rises at time t18, the D flip-flop 18 turns to a low level because the D flip-flop latches the output of the D flip-flop 17.

As described above, after the signal processing circuit detects a rise (fall) in the wobble signal, the signal processing circuit starts counting the clock signal that has passed the AND gates up to a predetermined count (8 in this case) to measure the width of the high (low) level of the wobble signal including the chattering noise, but ignores the width of the low (high) level of the wobble signal. The pulse signal that is outputted by the RS flip-flop 16 has the pulse width that is equal to the total width of high (low) level pulses including the high (low) level pulses caused by the chattering noise. In other words, the pulse signal that is outputted by the signal generator is an imaginary pulse that is formed by gathering all high (low) level pulses.

Accordingly, the signal processing circuit eliminates the effect of the chattering noise contained in the input signal, and can measure the time periods of a high level pulse and a low level pulse correctly.

Although the embodiment described above is the case in which the present invention is applied to an optical disk drive, the present invention is not limited to this embodiment, but is applicable to the case in which the pulse width (whichever high or low) of a pulse signal is to be measured.

[Variation of the Embodiment]

The chattering noise reduction unit of this embodiment measures accumulative time by a digital circuit that counts the clock, but it is possible to measure the accumulative time by analog circuit in which a capacitor is charged to measure a predetermined time.

Figure 3:
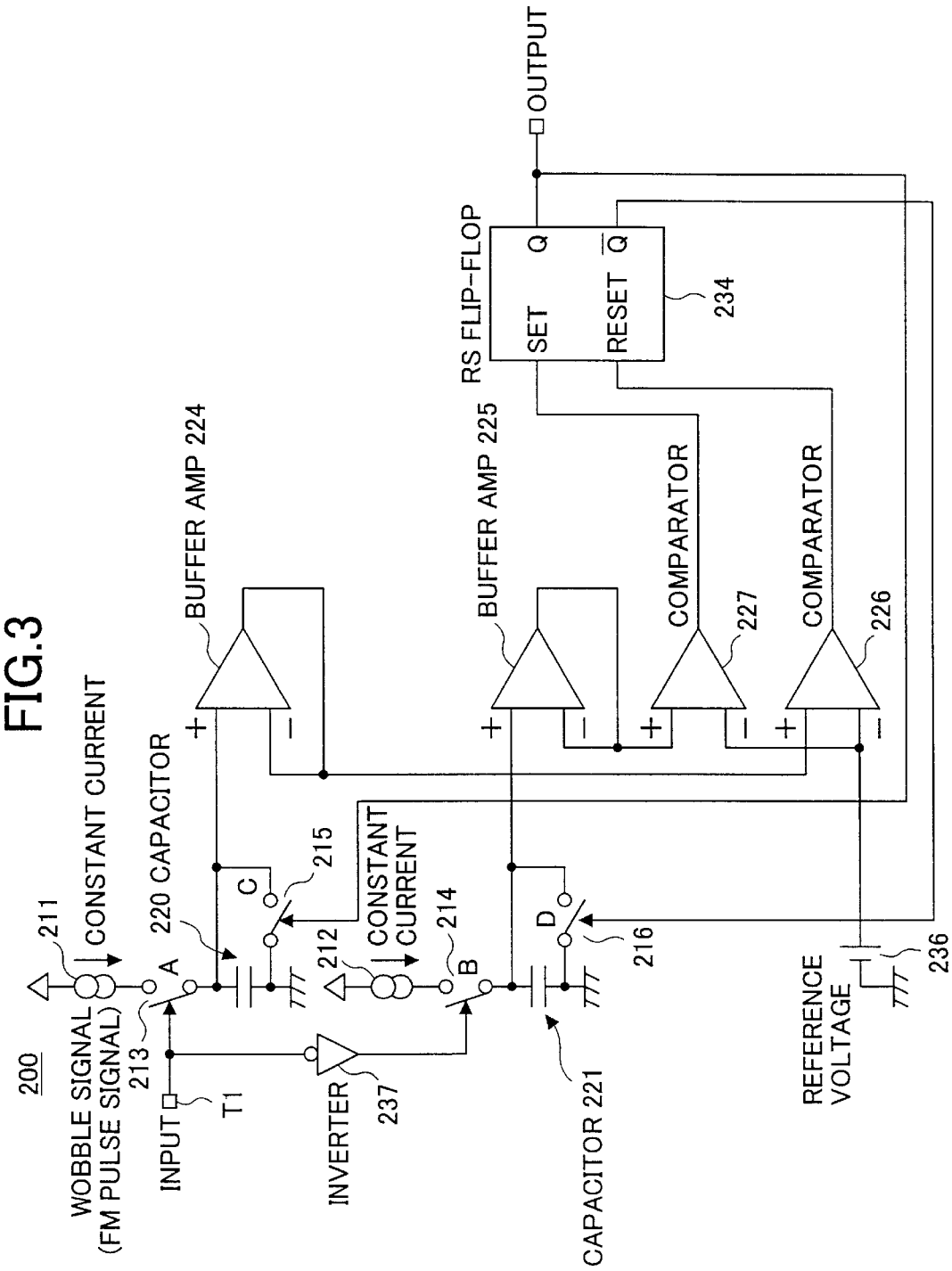
FIG. 3 is a block diagram showing a variation of the signal circuit shown in FIG. 1.

FIG. 3 is a block diagram showing a variation of the noise reduction unit described above.

The components that are common to those shown in FIG. 1 are referred to by the same numeral, and their description is omitted.

A noise reduction unit 200 in connection with the embodiment of the present invention includes current sources 211 and 212, analog switches 213-216, capacitors 220 and 221, buffer amplifiers 224 and 225, comparators 226 and 227, an RS flip-flop 234, a reference voltage source 236, and an inverter 237.

The operation of the noise reduction unit 200 will be described with reference to FIG. 4.

Figure 4:
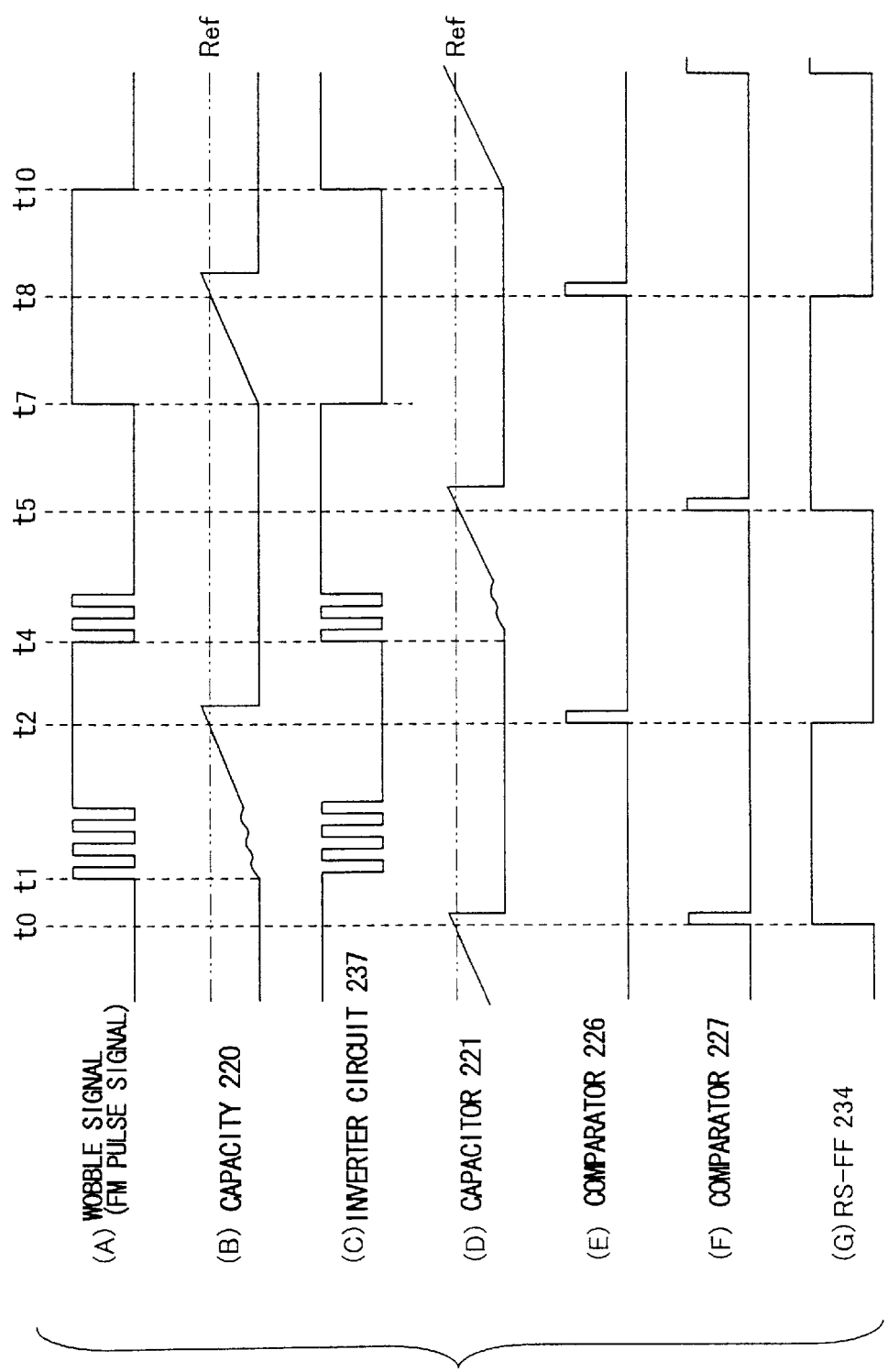
FIG. 4 is a schematic drawing showing waveforms of the signal processing circuit shown in FIG. 3.

FIG. 4 is a waveform of the noise reduction unit shown in FIG. 3. FIG. 4(A) is a wobble signal as an input pulse signal; FIG. 4(B) is the change in voltage charged in the capacity 220; FIG. 4(C) is the output of the inverter circuit 237; FIG. 4(D) is the change in the voltage charged in the capacitor 221; FIG. 4(E) is the output of the comparator 226; FIG. 4(F) is the output of the comparator 227; FIG. 4(G) is the output of the RS flip-flop 234.

The wobble signal shown in FIG. 4(A) is the FM pulse signal that is provided to the analog switch circuit 213 and the inverter circuit 237 through the terminal T1. As shown in FIG. 4(C), the inverter circuit 237 provides the wobble signal, after inverting it, to the analog switch circuit 214. The analog switch circuit 213 is turned on when the pulse signal inputted through the terminal T1 is in a positive polarization, and is turned off if the pulse signal is in a negative polarization. The analog switch circuit 214 is turned on when the pulse signal through the inverter circuit 237 is in a positive polarization, and is turned off if in the negative polarization.

When the output of the comparator 227 rises to a high level, the RS flip-flop sets the non-inverted output Q to a high level and the inverted output /Q to a low level. When the non-inverted output Q of the RS flip-flop 234 is turned to a high level, the analog switch circuit 215 turns off, and the capacitor 220 becomes chargeable by the input pulse signal.

The inverted output /Q of the RS flip-flop 234 is turned to a low level. When /Q is at the low level, the analog switch circuit 214 is turned on, and the capacitor 221 is discharged. Since the voltage of the non-inverted input terminal of the comparator 227 becomes lower than the standard voltage, the output of the comparator 227 turns to a low level.

The capacitor 220 is charged by the constant current source 221 in the time period from time t1 while the input pulse signal is at a high level. When the charged voltage of the capacitor 220 becomes higher than a predetermined voltage at time t2, the voltage of the non-inverted input terminal of the comparator 226 becomes higher than the predetermined voltage. This turns the output of the comparator 226 from a low level to a high level.

When the output of the comparator 226 turns from a low level to a high level, the RS flip-flop is reset. The non-inverted output Q is set at a low level, and the inverted output /Q is set at a high level.

When the inverted output /Q of the RS flip-flop is turned to a high level, the analog switch circuit 216 is turned off, and as a consequence, the capacitor 221 is enabled to be charged in response to the pulse signal from the inverter circuit 237.

On the other hand, when the non-inverted output Q of the RS flip-flop 234 is turned to a low level, the analog switch circuit 215 is turned on. By the turning on of the analog switch circuit 215, the capacitor 220 is discharged. Consequently, the voltage of the non-inverted input terminal of the comparator 226 becomes lower than the reference voltage provided by the reference voltage source 236, the output of the comparator 226 turns to a low level.

As described above, the capacitor 220 is charged while the input signal is at a high level, and the capacitor 221 is charged while the input signal is at a low level. The role of the capacitors in this variation is equivalent to the role of the counters in the embodiment explained above.

When the voltage charged in the capacitors reaches a reference voltage provided by the reference voltage source, the output signal is turned to a high (low) level, and the capacitor 220 (221) is discharged to prepare for the next high (low) pulse.

In this variation of the present invention, the noise reduction unit includes the constant current sources 211 and 212, an inverter circuit 237, and analog switch circuits 213, 214, and 215 that control the timing of charging and discharging the capacitors 220 and 221, but the noise reduction unit can be simplified as described below.

[Another Variation of the Embodiment]

Figure 5:
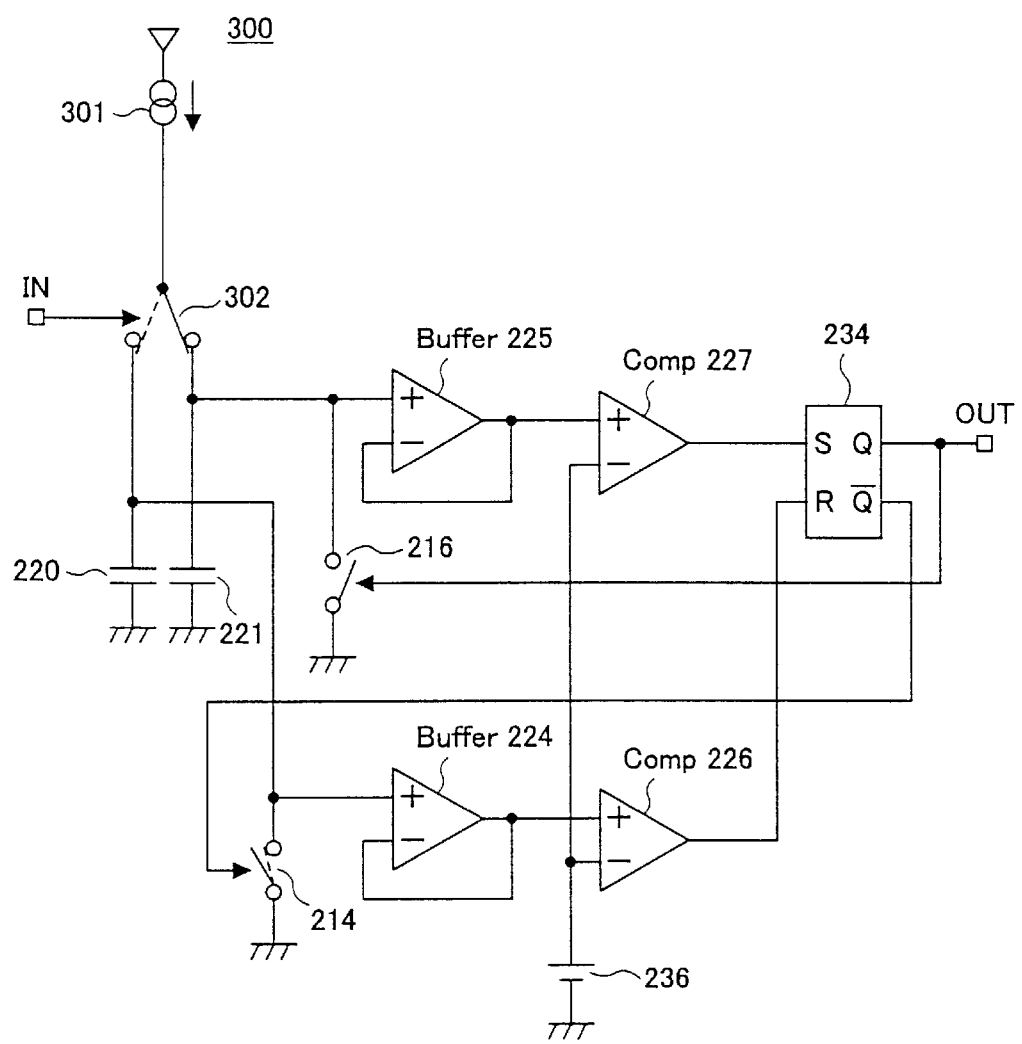
FIG. 5 is a block diagram showing another variation of the signal circuit shown in FIG. 1.

FIG. 5 is a block diagram showing another variation of the noise reduction circuit.

A noise reduction circuit 300 of this variation includes a constant current source 301 and an analog switch circuit 302 that controls the timing of charging and discharging the capacitors 220 and 221.

The constant current source 301 provides a constant current to charge the capacitors 220 and 221 through the analog switch circuit 302. The analog switch circuit 302 switches the constant current provided by the constant current source 301, when the input pulse signal is at a high level, to the capacitor 220 and, when the input pulse signal is at a low level, to the capacitor 221.

The noise reduction circuit shown in FIG. 5 operates in the same manner as the noise reduction circuit shown in FIG. 3, since the capacitor 220 is charged while the input pulse signal is at a high level, and the capacitor 221 is charged while the input pulse signal is at a low level.

This description of the embodiments is given based on the application of the present invention to optical disk drives, but the present invention is not limited to the embodiments relative to the optical disk drives. This invention is widely applicable to the case where the pulse width of a high or low level needs to be measured. The present invention is further applicable to various fields including a communications system where a signal processing circuit of a cyclic signal that is modulated in FM modulation and FSK modulation, for example, is required.

Further, the present invention is not limited to the embodiments described above, and variations and modifications may be made without departing from the scope of the present invention.

The present application is based on Japanese priority applications No. 2001-044222, filed on Feb. 20, 2001, and No. 2001-272571, filed on Sep. 7, 2001, the entire contents of which are hereby incorporated by reference.

What is claimed is:

1. A signal processing circuit for converting an input signal containing chattering noise therein into an output signal, comprising:

a first accumulative timer that starts, in response to a first change in said input signal from a first input level to a second input level after discharge from a reset state, for measuring a first time period when said input signal is at said second input level, wherein said first timer provides a first signal when said first time period reaches a first predetermined time with said first timer being reset in response to a first change in said output signal from a first output level to a second output level; and a signal generator for switching in response to said first signal sent by said first accumulative timer, said output signal to said second output level.

2. The signal processing circuit claimed in claim 1, further comprising:

a second accumulative timer that starts, in response to a first change in said input signal from said second input level to said first input level after discharge from a reset state, for measuring a second time period in which said input signal is at said first input level, wherein said second timer provides a second signal when said second time period reaches a second predetermined time, with said second timer being reset in response to a second change in said output signal from said second output level to said first output level, wherein reset in response to a second change in said output signal from said second output level to said first output level, wherein said signal generator switches, in response to said second signal sent by said second accumulative timer, said output signal to said first output level; and said first predetermined time and said second predetermined time are determined in connection with a duty ratio of said first input level and said second input level.

3. The signal processing circuit claimed in claim 1, wherein said first accumulative timer further comprises a first gate that passes a clock signal during said first time period in which said input signal is at said second input level, and a first counter that counts said clock signal that has passed said first gate, sends said first signal when an accumulative count of said clock signal that has passed said first gate reaches a predetermined number, and is reset in response to said first change in said output signal from said first output level to said second output level; and said signal generator is a flip-flop circuit that is set in response to said first signal sent by said first counter.

4. The signal processing circuit claimed in claim 2, wherein said first accumulative timer further comprises a first gate that passes a clock signal during said first time period in which said input signal is at said second input level, and a first counter that counts said clock signal which has passed said first gate, sends said first signal when an accumulative count of said clock signal that has passed said first gate reaches a predetermined number, and is reset in response to said first change in said output signal from said first output level to said second output level; and said second accumulative timer further comprises a second gate that passes a clock signal during said second time period in which said input signal is at said first input level, and a second counter that counts said clock signal that has passes said second gate, sends said second signal when an accumulative count of said clock signal which has passed said second gate reaches said predetermined number, and is reset in response to said second change in said output signal from said second output level to said first output level; and said signal generator is a flip-flop circuit that is set in response to said first signal sent by said first counter, and is reset in response to said second signal sent by said second counter.

5. The signal processing circuit as claimed in claim 3, further comprising:

a first delay circuit that delays said output signal by a first delay time;

a second delay circuit that delays an output of said first delay circuit by a second delay time;

a counter that is reset in response to a first rise edge and a first fall edge in an output of said second delay circuit, and counts said clock signal; and a latch circuit that latches an accumulative count of said counter in response to a second rise edge and a second fall edge in said output of said first delay circuit.

6. The signal processing circuit as claimed in claim 1, wherein said first accumulative timer further comprises:

a capacitor that is charged during said first time period in which said input signal is at said second input level, and is discharged in response to said first change in said output signal from said first output level to said second output level; and a comparator that determines whether a charge stored in said capacitor reaches a predetermined voltage level, and sends first signal to said signal generator.

7. A signal processing method for converting an input signal having chattering noise therein into an output signal, comprising:

a step of starting a first accumulative timer in response to a first change in said input signal from a first input level to a second input level after discharge from a reset state;

a step of measuring a first time period in which said input signal is at said second input level;

a step of activating a signal generator when said first predetermined time has passed to generate a switching signal;

a step of switching said output signal to said second output level in response to said switching signal; and a step of resetting said first accumulative timer in response to a change in said output signal from said first output level to said second output level.

8. The signal processing method claimed in claim 7, further comprising:

a step of starting a second accumulative timer in response to a first change in said input signal from said second input level to said first input level after discharge from a reset state;

a step of measuring a second time period in which said input signal is at said first input level;

a step of activating said signal generator when a second predetermined time has passed to generate a switching signal;

a step of switching said output signal to said first output level in response to said switching signal; and a step of resetting said second accumulative timer in response to a change in said output signal from said second output level to said first output level;

wherein said first predetermined time and said second predetermined time are determined in connection with a duty ratio of said first input level and said second input level.

9. A signal processing method for converting an input signal containing chattering noise therein into an output signal, comprising:

a step of starting a first counter in response to a first change in said input signal from a first input level to a second input level after discharge from a reset state;

a step of counting a clock signal that passes a first gate;

a step of activating a signal generator when a first count of said first counter becomes a first predetermined value for generating a switching signal;

a step of switching said output signal to said second output level in response to said switching signal; and a step of resetting said first counter in response to a change in said output signal from said first output level to said second output level;

wherein said clock signal passes through said first gate when said input signal is at said first input level.

* * * * *